United States Patent
Stuber et al.

(10) Patent No.: US 6,285,900 B1
(45) Date of Patent: Sep. 4, 2001

(54) METHOD AND DEVICE FOR GENERATING A PERFUSION IMAGE OF A BODY PORTION USING MAGNETIC RESONANCE IMAGING

(75) Inventors: Matthias Stuber, Brookline, MA (US); Klaas P. Pruessmann; Xavier G. Golay, both of Zürich (CH); Markus B. Scheidegger, Bisikon (CH); Peter Boesiger, Ennetbaden (CH)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/209,067

(22) Filed: Dec. 10, 1998

(30) Foreign Application Priority Data

Dec. 12, 1997 (EP) .................................................. 97203906

(51) Int. Cl.[7] .................................................. A61B 5/055
(52) U.S. Cl. ........................ 600/410; 600/419; 324/306; 324/309
(58) Field of Search .................................. 600/410, 419; 324/306, 307, 309

(56) References Cited

U.S. PATENT DOCUMENTS 5,402,785  4/1995  Leigh et al. .

5,846,197 * 12/1998  Edelman .............................. 600/419

* cited by examiner

Primary Examiner—Ruth S. Smith
(74) Attorney, Agent, or Firm—John F. Vodopia

(57) ABSTRACT

The invention relates to a magnetic resonance method for determining a perfusion image of a portion, which method comprises the following steps: generation of a control pulse sequence in a first portion of the body and measurement of a control data set by generation of an MR-image sequence for imaging of an third portion of the body, generation of a labelling pulse sequence in a second portion of the body wherein a fluid flows towards the third portion, and measurement of the labelled data set by generation of the MR-image sequence for imaging the third portion of the body, and reconstruction of the perfusion image of the fluid in a mass of the third portion of the body from a combination of the control data set and the labelled data set. In order to reduce the geometric restrictions and compensate magnetic transfer effects, the labelling pulse sequence comprises a first selective RF pulse and a second RF pulse, the control pulse sequence comprises the first selective RF pulse and a third RF pulse, a phase of the second RF pulse being opposite to that of the third RF pulse.

15 Claims, 5 Drawing Sheets

METHOD AND DEVICE FOR GENERATING A PERFUSION IMAGE OF A BODY PORTION USING MAGNETIC RESONANCE IMAGING

BACKGROUND OF THE INVENTION

1. Field of the Invention

The invention relates to a method for determining a perfusion image of a portion of a body placed in a static magnetic field by means of magnetic resonance (MR), which method comprises the following steps of:
generation of a control pulse sequence in a first portion of the body and measurement of a control data set by generation of an MR-image sequence for imaging of an third portion of the body to be imaged.
generation of a labelling pulse sequence in a second portion of the body wherein a fluid flows towards the third portion, and measurement of the labelled data set by generation of the MR-image sequence for imaging the third portion of the body, reconstruction of the perfusion image of the fluid in a mass of the third portion of the body from a combination of the control data set and the labelled data set. The invention further relates to an MR apparatus for carrying out such a method.

2. Description of the Related Art

Such a method is known from U.S. Pat. No. 5,402,785. In the known method, after the control preparation by the control pulse sequence, the control data set is measured from the third portion of the body by the MR image sequences, and after labelling the fluid by the inversion of the proton spins of the fluid by the labelling pulse sequence in the second portion of the body, the labelled data set is measured from the third portion of the body, for example, a slice of the head of a body. From the control data set and the labelling data set, respectively, a control image and a labelled image are reconstructed. The perfusion image is then determined by a combination of the control image and the labelled image, for example by subtraction of the control image from the labelling image. In the known method, magnetisation transfer effects suppress magnetic resonance signals, whereby the rate of suppression varies for different types of tissues and blood. Also magnetic resonance signals from blood, are reduced by the magnetic transfer effects. As a result, the contrast of the perfusion image is affected. In order to reduce magnetic transfer effects in the known method, the first portion and the second portion are positioned symmetrically with respect to the third portion of the body. A drawback of the known method is that geometric restrictions exist in the choice of the third portion of the body.

SUMMARY OF THE INVENTION

It is inter alia an object of the invention to reduce the geometric restrictions in the choice of the third portion of the body. To this end, a method in accordance with the invention is characterised in that the labelling pulse sequence comprises a first selective RF pulse and a second RF pulse, the control pulse sequence comprises the first selective RF pulse and a third RF pulse, a phase of the second RF pulse being opposite to that of the third RF pulse. In this way a magnetisation transfer-insensitive labelling technique can be performed, wherein the positions of the first and second portions coincide and the geometric restriction in the choice of the imaging portion is reduced. The invention is based on the insight that the control pulse sequence and the labelling pulse sequence both effect a z-magnetisation of the bound water in the same way by taking advantage of a difference between a transverse relaxation time $T_2$ of bound water and of free water. Because of the relatively short transverse relaxation time $T_2$ of bound water compared to that of free water, the z-magnetisation of the bound water, resulting from the application of the first selective RF pulse and the second RF pulse and the first selective RF pulse and the third RF pulse, does not depend on a phase relation between the first selective RF pulse and the second RF pulse or a phase relation between the first selective RF pulse and the third RF pulse. When the interval between the first selective RF pulse and the second RF pulse and between the first selective RF pulse and the third RF pulse is long enough with respect to the transverse relaxation time $T_2$ of bound water, the magnetic transfer effects due to the labelling and control pulse sequences are equal and the magnetic transfer effects can be cancelled by combining data of the control image and the labelling image.

A further advantage is that the method can be combined with multi-slice and angulated MR imaging because the magnetisation transfer compensation is not restricted geometrically. Furthermore, because the first portion coincides with the second portion no distal labelling is induced in the first portion and distal inflow from the first portion into the second portion does not impair perfusion assessment.

A particular version of the method in accordance with the invention is characterised in that the first selective RF pulses and the second RF pulse are applied according to a first modulation function of time and the third RF pulse is applied according to a second modulation function, which is the same as the first modulation function, but of an opposite sign. In this way, the labelling and control preparations yield a maximum difference in the magnetisation of free water within the desired second portion and no difference in the magnetisation outside the second portion.

A further version of the method in accordance with the invention is characterised in that the labelling and control sequences comprise second magnetic field gradient pulses, the first magnetic field gradient pulses being applied with the first selective RF pulse according to a first gradient function of time, the second magnetic field gradient pulses being applied with the second RF pulse according to a second gradient function of time, being a time-reversed version of the first gradient function, and the sign of the second gradient function being opposite to that of the first gradient function, the first selective RF pulse being applied according to a first amplitude modulation function of time and a first frequency modulation function of time, the second RF pulse being applied according to a second amplitude modulation function and a second frequency modulation function, the second amplitude modulation function being a time-reversed version of the first amplitude function and the second frequency modulation function being a time-reversed version of the first frequency modulation function, the sign of the second frequency modulation function being opposite to that of the first frequency modulation function, the third RF pulse being applied according to a third amplitude modulation function and the second frequency modulation function, the third amplitude modulation function being the same as the second amplitude modulation function, but of opposite sign.

The result of the concatenation of the first selective RF and the second RF pulses is that a quality of the second portion is improved, for example, a highly selective inversion pulse can be obtained by a concatenation of the first selective RF pulse and second RF pulse, because a flip angle of the z-magnetisation is exactly doubled at all positions within the second portion. The concatenation of the first selective RF pulse and the third RF pulse results in a flip angle of zero degrees. Furthermore, an advantage of a high-quality labelling slab is that a minimum gap between the second portion and the third portion can be reduced.

A further version of the method in accordance with the invention is characterised in that the method comprises a further step of generating a refocussing RF pulse between the first selective RF pulse and the second RF pulse and between the first selective RF pulse and the third RF pulse, respectively. The effect of the refocussing pulses, for example a centred 180 degrees refocussing pulse, is that a reduction of the effects of magnetic field inhomogeneities is obtained.

A further version of the method in accordance with the invention is characterised in that a flip angle of the first selective RF pulse and the flip angle of the second and third RF pulses are about 90°. Concatenations of 90° pulses can be advantageously applied as a selective inversion pulse.

A further version of the method in accordance with the invention is characterised in that an interval between the first and second RF pulses and between the first and third RF pulses is larger than the transverse relaxation time of bound water. In this way, the magnetization transfer effects due to the labelling and control pulse sequences can be completely cancelled. The invention further relates to a magnetic resonance imaging device.

These and other aspects of the invention will be apparent from and elucidated with reference to the embodiments described hereinafter.

DETAILED DESCRIPTION OF THE PREFERRED EMBODIMENT

Figure 1:
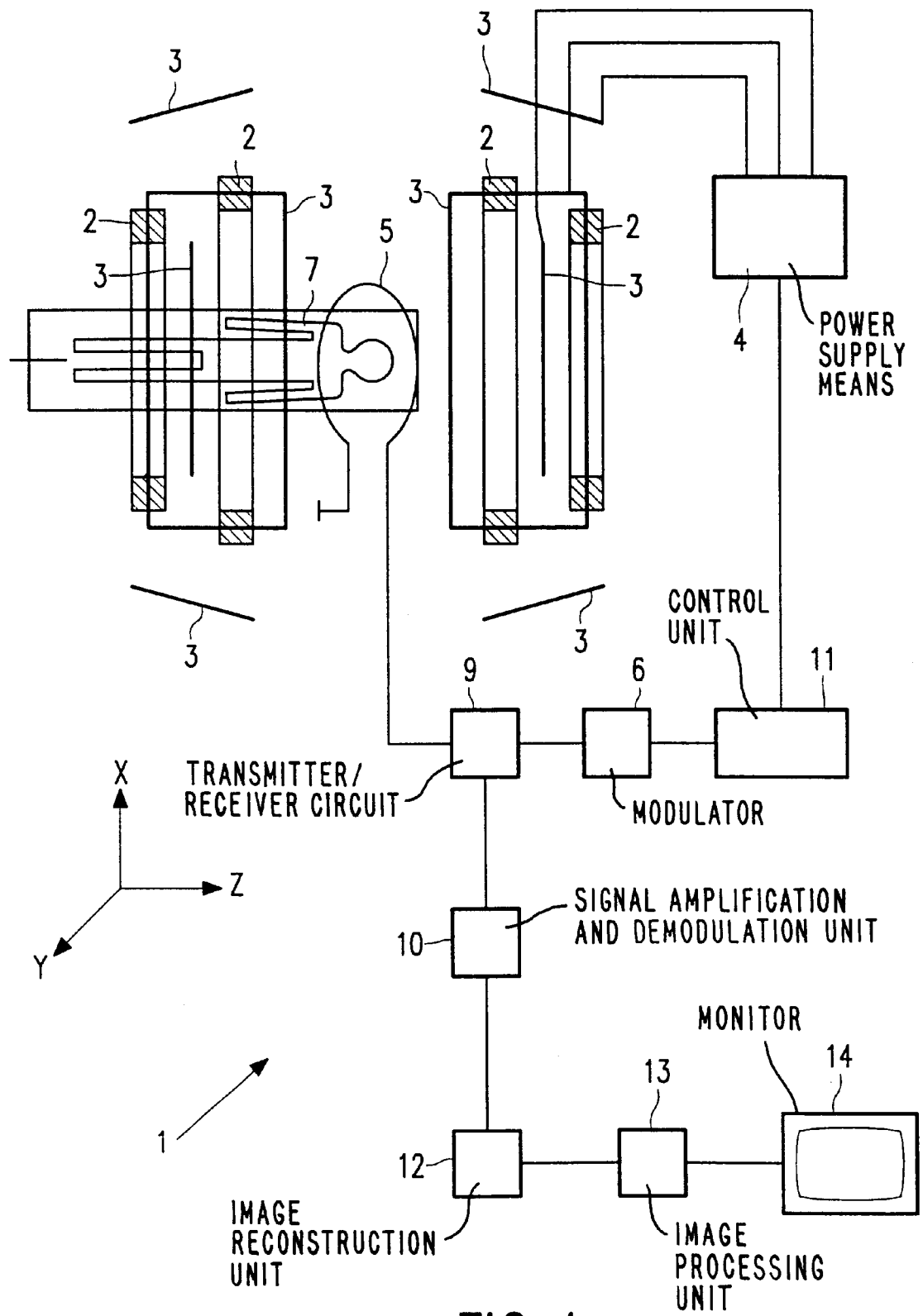
FIG. 1 shows an embodiment of an MR apparatus.

FIG. 1 shows an embodiment of an MR apparatus 1. The MR apparatus 1 comprises a first magnet system 2 for generating a steady magnetic field. The z-direction of the co-ordinate system shown corresponds to the direction of the steady magnetic field in the magnet system 2. The MR apparatus also comprises a second magnet system 3 for generating temporary magnetic fields directed in the z-direction and gradients in the x, y and z direction, respectively. It is to be noted that for ease of argument x, y and z are used for the frequency encode, phase encode and selection direction, respectively. These directions do not have to coincide with the main directions of the system. Furthermore, in this Application the temporary gradient fields having a gradient in the x-direction, the y-direction and the z-direction are referred to as read gradient, phase-encode gradient and slice-selection gradient, respectively. Power supply means 4 feed the second magnet system 3. The magnet system 2 encloses an examination space which is large enough to accommodate a part of an object 7 to be examined, for example a part of a human body. An RF transmitter coil 5 serves to generate RF magnetic fields and is connected via a transmitter/receiver circuit 9 to an RF source and a modulator 6. The RF transmitter coil 5 is arranged around the part of the body 7 in the examination space. The MR apparatus also comprises a receiver coil which is connected via the transmitter/receiver circuit 9 to a signal amplification and demodulation unit 10. The receiver coil and the RF transmitter coil 5 may be one and the same coil. A control unit 11 controls the modulator 6 and the power supply means 4 in order to generate MR imaging sequences comprising RF-pulses and temporary magnetic gradient fields. After excitation of nuclear spins in a part of the body placed within the examination space, the receiver coil 5 receives an MR signal. The phase and amplitude derived therefrom are sampled and further processed in the amplification and demodulation unit 10. An image reconstruction unit 12 processes the MR signals presented so as to form an image. The image is displayed, for example on a monitor 14. The control unit 11 also controls the image reconstruction unit 12.

Figure 2:
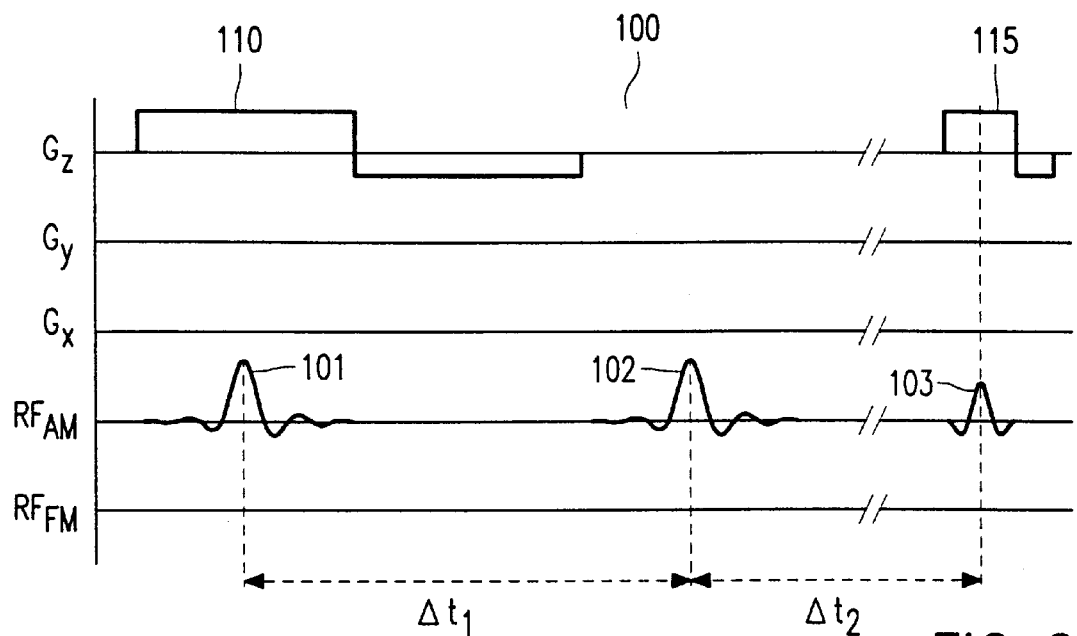
FIG. 2 shows a first example of a labelling pulse sequence.

In FIG. 2 an example of a first labelling pulse sequence 100 in accordance with the invention is shown which is used to prepare a second portion of a body. For example, a first slice wherein a fluid flows towards the second portion of the body. The third portion is, for example, a second slice parallel to the first slice in the head of the body. In this figure, as in FIG. 3, time proceeds from left to right and the various rows indicate diagrammatically the time relation between the RF pulses, magnetic field gradient pulses and magnetic resonance signals. In the three upper rows, labelled $G_x$, $G_y$, $G_z$, the magnetic field gradient pulses are shown, in the following rows, labelled $RF_{AM}$ the radio frequency pulses are shown. By means of an RF pulse 101 the magnetisation of the bound and free water protons due to the stationary magnetic field is rotated and a transverse component of the magnetisation is obtained. The RF pulse 101 is made slice-selective by a first magnetic field gradient pulse 110 in the second portion of the body in which the Larmor frequency is equal to the RF frequency of the RF-pulse 101. A second RF pulse 102 is applied after an interval $\Delta t_1$ after the first RF pulse 101, the first and second RF pulses 101,102 are applied according to a first modulation function of time $f_{mod1}$ (t) of duration T. By means of the second RF pulse 102 the magnetisation of the free water protons is rotated through a second angle that equals the first angle. Preferably, the interval $\Delta t_1$ should be larger than the transverse relaxation time $T_2$ of the bound water protons 1. In that case the magnetisation of the free water is inverted with respect to the magnetisation of the relaxed protons of free water and the phase relation of the spins of bound water protons between the first and second RF pulses and the first and third RF pulses is lost. Preferably, the flip angle of the first and second RF pulses equals about 90 degrees. After a delay $\Delta t_2$, an imaging sequence is applied for imaging of the imaging portion. An example of an imaging sequence is an echo-planar imaging (EPI) sequence. The EPI-imaging sequence is known from "Magnetic Resonance Imaging", by M. T. Vlaardingerbroek, 1996. For the sake of simplicity, a, first excitation pulse 103 and a slice-selective magnetic field gradient 115 of the EPI sequence are only shown in FIGS. 2, 3, 6, and 7.

Figure 3:
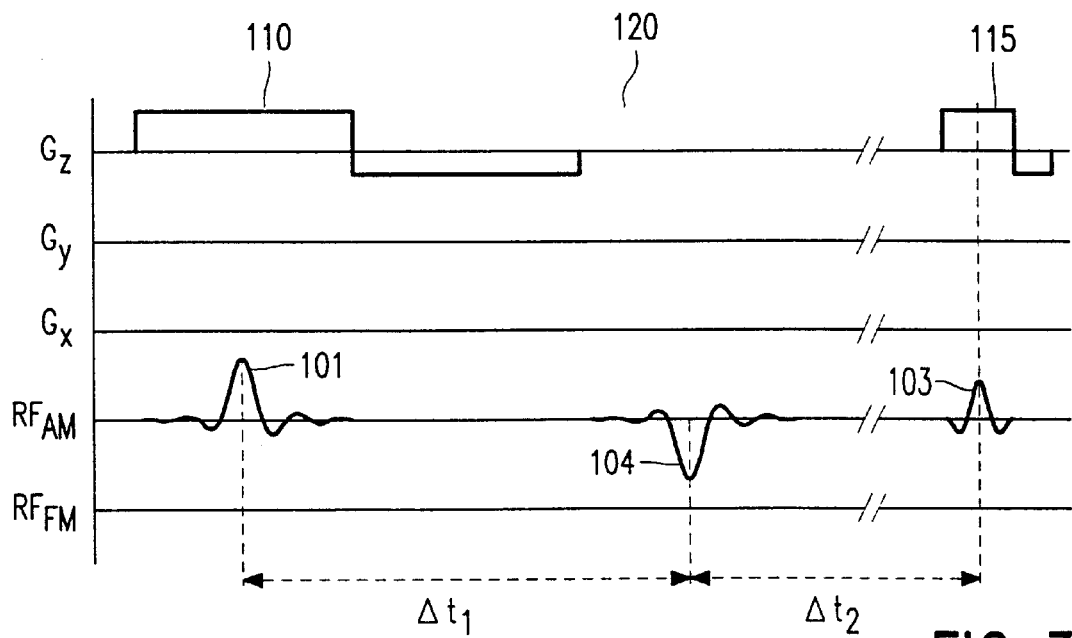
FIG. 3 shows a first example of a control pulse sequence.

FIG. 3 shows an example of a first control pulse sequence 120 in accordance with the invention for control preparation of the first portion. According to the invention the first portion of the body is the same as the second portion of the body. By means of the first RF pulse 101 the magnetisation of the bound and free water protons due to the stationary magnetic field is rotated and a transverse component of the magnetisation is obtained. The first RF pulse 101 is made slice-selective by application of the first magnetic field gradient pulse 110 in the second slice of the body in which the Larmor frequency is equal to the RF frequency of the first RF-pulse 101. A third RF pulse 104 is applied an interval $\Delta t_1$ after the first RF pulse 101, the third RF pulse 104 is applied according to a second modulation function $f_{mod2}(t)$ being the same, as the first modulation function, but of opposite sign, so that $f_{mod2}(t)=-f_{mod1}(t)$. By means of the third RF pulse 104 the magnetisation of the free water protons is rotated towards the z-axis through a second angle that equals the first angle, so that the net rotation angle is equal to zero degrees. In this way a phase offset of 180 degrees is obtained between a phase of the second RF pulse 102 and the phase of the third RF pulse 104. Preferably, flip angles of the first selective RF pulse 101 and second and third RF pulses 102, 104 are equal to 90 degrees. Furthermore, both first labelling and first control pulse sequences 100, 120 are followed by an EPI imaging sequence to measure MR signals for reconstruction of a labelling image and a control image of the imaging slice. Only a first excitation RF pulse 101 and the slice-selective magnetic field gradient pulse 110 are shown in FIG. 2 and FIG. 3. In order to reduce artefacts due to inhomogeneities in the static magnetic field, refocusing pulses can be applied in the middle of the first and second RF pulses 101,102 and in the middle of the first and third pulses 101,104.

Figure 4:
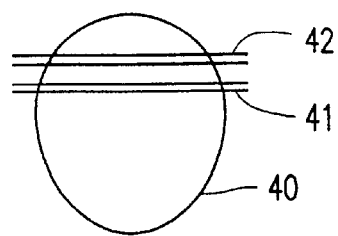
FIG. 4 shows the position of second and third portion.

A perfusion image is then obtained by taking a difference between the control image and the labelling image. Furthermore, for a reliable perfusion image the second slice and the third slice must not overlap. FIG. 4 shows a portion of a human head with a second slice and an third slice. In FIG. 4, the third slice 41 is directed parallel to the imaging slice 42 through the head 40.

Figure 5:
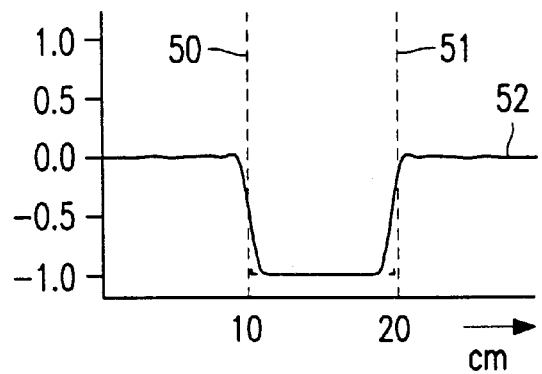
FIG. 5 graphically shows first estimates of the z-magnetisation of free water and of bound water.
Figure 5:
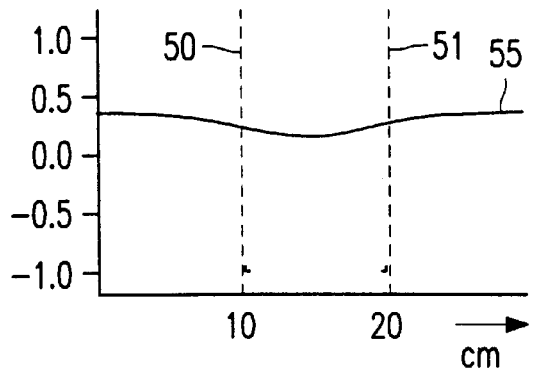
Figure 5:
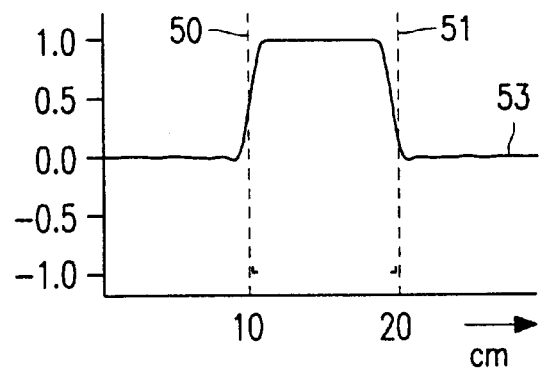
Figure 5:
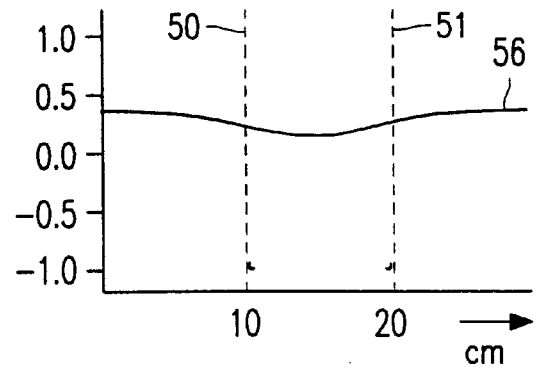
Figure 5:
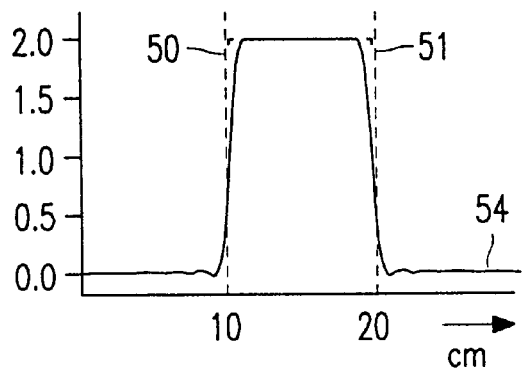
Figure 5:
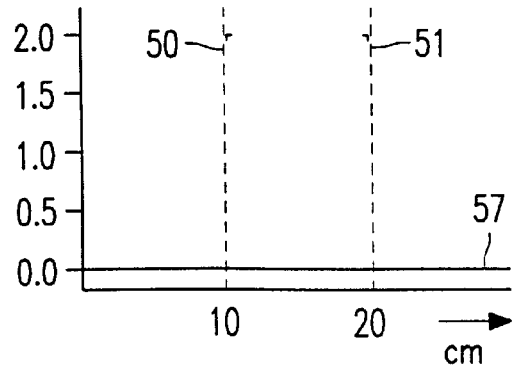

The effects of the first labelling and first control pulse sequences are simulated numerically. The results are shown in FIG. 5. FIG. 5 graphically shows first estimates of the z-magnetisation of free water and bound water as a function of distance along the z-direction. Furthermore, preferably, the interval $\Delta t_1$ has to be chosen such that a transverse relaxation time $T_2$ of the bound water is short with respect to the interval $\Delta t_1$. A value of $T_2$ of the bound water amounts, for example, to 50 microseconds. The position of the second slice is shown by the dotted lines 50,51. The z-magnetisation of the free water outside the second slice after performing the first labelling pulse sequence 100, indicated by a first line 52. The z-magnetisation of the free water outside the second slice after performing the first control pulse sequences 120, is indicated by a second line 53. The difference between the z-magnetisation after performing the first labelling and first control pulse sequences 100,120 is shown by a third line 54. The z-magnetisation of the bound water after performing the first labelling pulse sequence 100, indicated by a fourth line 55. The z-magnetisation of the bound water after performing first control pulse sequences 120, is indicated by a fifth line 56. The difference between the z-magnetisation values of the bound water after performing the first labelling and first control pulse sequences 100, 120 is shown by a sixth line 57.

Figure 6:
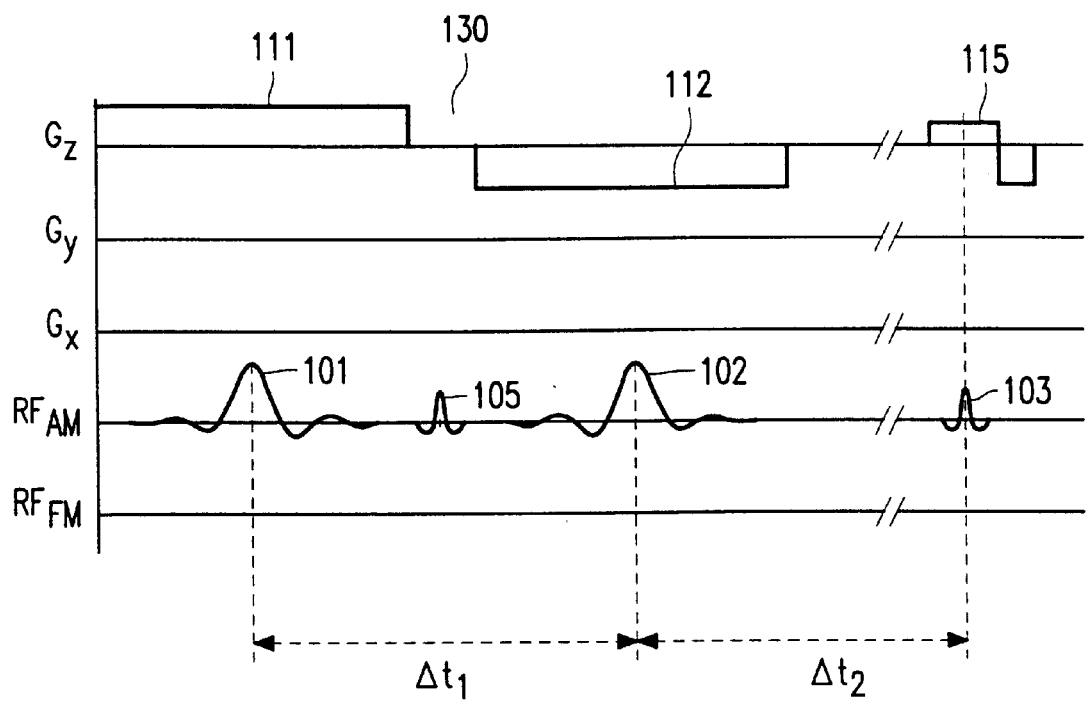
FIG. 6 shows a second example of a labelling pulse sequence.

In order to improve the selectivity and the robustness of the control sequence, second labelling and control pulse sequences in accordance with the invention can be applied. FIG. 6 shows an example of the second labelling pulse sequence 130, which is applied to prepare the second slice. By means of the RF pulse 101 the magnetisation of the bound and free water protons due to the stationary magnetic field is rotated and a transverse component of the magnetisation is obtained. The first RF pulse is applied according to a first amplitude modulation function of time $f_{am1}(t)$ and a first frequency modulation function of time $f_{fm1}(t)$. The first RF pulse 101 is made slice-selective in the second slice of the body by a second magnetic field gradient pulse 111 applied according to a first gradient function $f_{grad1}(t)$. Furthermore, the first amplitude modulation function of time $f_{am1}(t)$, the first frequency modulation function of time $f_{fm1}(t)$ and the first gradient function $f_{grad1}(t)$ have a duration $T_1$. In the second slice the Larmor frequency is equal to the RF frequency of the RF-pulse 101. A second RF pulse 102 is applied an interval $\Delta t_1$ after the first RF pulse 101. The second RF pulse 102 is applied according to a second amplitude modulation function $f_{am2}$ and a second frequency modulation function $f_{fm2}(t)$, the second amplitude modulation function being a time-reversed version of the first amplitude modulation function, so that $f_{am2}(t)=f_{am1}(T-t)$. The second frequency modulation function $f_{fm2}(t)$ is a time-reversed version of the first frequency modulation function, the sign of the second frequency modulation being opposite to that of the first frequency modulation function, so that $f_{fm2}(t)=-f_{fm1}(T-t)$. For example, the second frequency modulation function $f_{fm2}(t)$ is obtained by a 180 degrees phase shift of the first frequency modulation function $f_{fm1}(t)$. Furthermore, the second RF pulse 102 is made slice-selective by a third magnetic field gradient pulse 112, which is applied according to a second gradient function $f_{grad2}$ of time, the second gradient function $f_{grad2}$ being a time-reversed version of the first gradient function $f_{grad1}$, the sign of the second gradient function being opposite to that of the first gradient function, so that $f_{grad2}(t)=-f_{grad1}(T-t)$. By means of the second RF pulse 102 the magnetisation of the free water protons is rotated towards the negative z-axis through a second angle that is equal the first angle, so that the net rotation angle is doubled.

Figure 7:
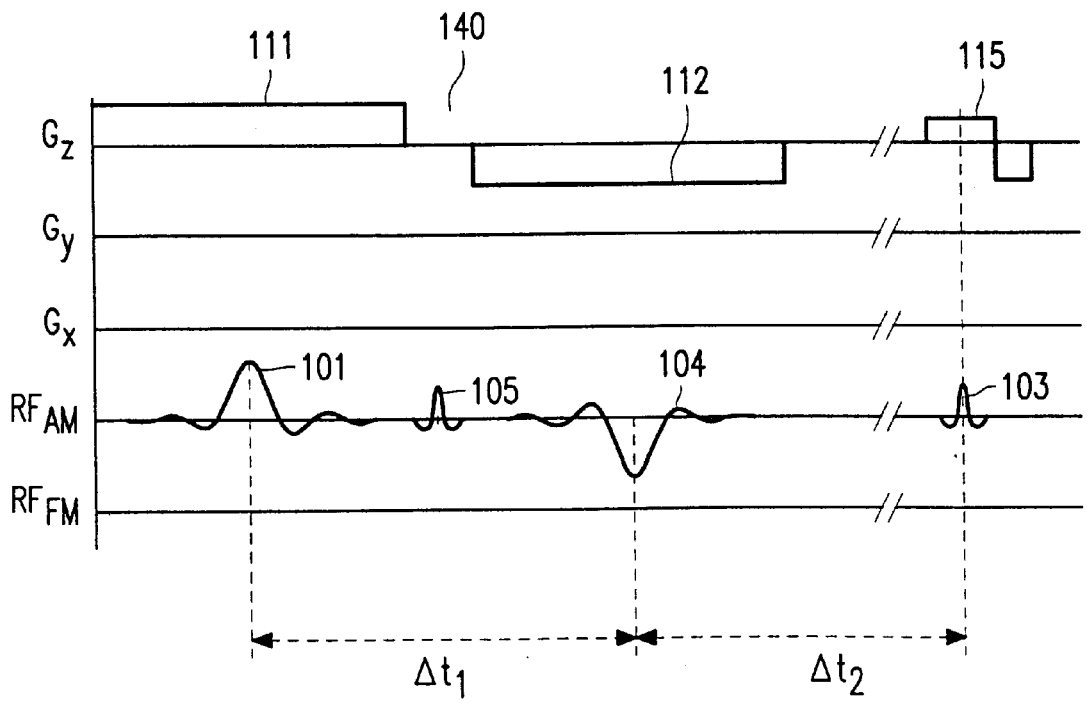
FIG. 7 shows a second example of a control pulse sequence, and FIG. 8 graphically shows second estimates of the z-magnetisation of free water and of bound water.

FIG. 7 shows an example of a second control pulse sequence 140, which is applied to prepare the second slice. The thickness of the slice amounts to 10 centimetres. By means of the RF pulse 101 the magnetisation of the bound and free water protons due to the stationary magnetic field is rotated and a transverse component of the magnetisation is obtained. The first RF pulse 101 is made slice-selective in the second slice portion of the body by the second magnetic field gradient pulse 111 applied according to the first gradient function $f_{grad1}(t)$. In the second slice the Larmor frequency is equal to the RF frequency of the first RF pulse 101. A third RF pulse 104 is applied an interval $\Delta t_1$ after the first RF pulse 101. The third RF pulse 104 is applied according to a third amplitude modulation function $f_{am3}(t)$ and the second frequency modulation function $f_{fm2}(t)$. The third amplitude modulation function $f_{am3}(t)$ is the same as the second amplitude modulation function, but of opposite sign, so that $f_{am3}(t)=-f_{am2}(t)$. The third RF pulse 104 is made slice-selective by the third magnetic field gradient pulse 112, which is applied according to the second gradient function $f_{grad2}(t)$. By means of the third RF pulse 104 the magnetisation of the free water protons is reversed to the positive z-axis through a second angle that equals the first angle, so that the net angle of rotation of the magnetisation of free water is zero degrees. Furthermore, both the second labelling pulse sequence 130 and the second control pulse sequences 140 are followed by an EPI imaging sequence to measure MR signals for reconstruction of a labelling image and a control image of the third slice. Only a first excitation RF pulse 103 and the slice-selective magnetic field gradient pulse 115 are shown in FIG. 6 and FIG. 7. A perfusion image is then obtained by taking a difference between the control image and the labelling image.

In order to reduce artefacts due to inhomogeneities in the static magnetic field a refocusing pulse 105 can be applied between the first selective RF pulse and the second RF pulse and between the first selective RF pulse and the third RF pulse, respectively. For example, in FIG. 6 and FIG. 7, the refocusing pulse 105 is applied a time Δt' after the first selective pulses 101 under the condition that 2Δt'=Δt$_1$. Furthermore, for a reliable perfusion image, the second slice and the third slice must not overlap. The effects of second labelling pulse sequences 130 and second control pulse sequences 140 are simulated numerically for a labelling slice with a thickness of 10 centimetres. The results are shown in FIG. 8.

Figure 8:
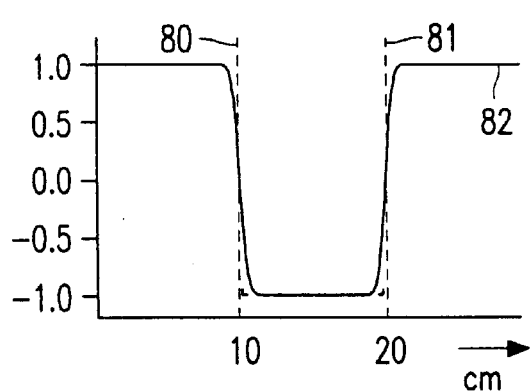
Figure 8:
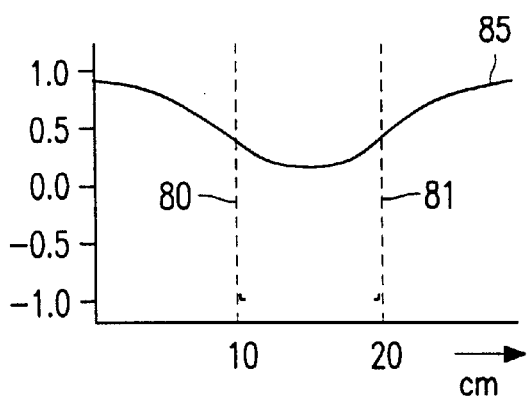
Figure 8:
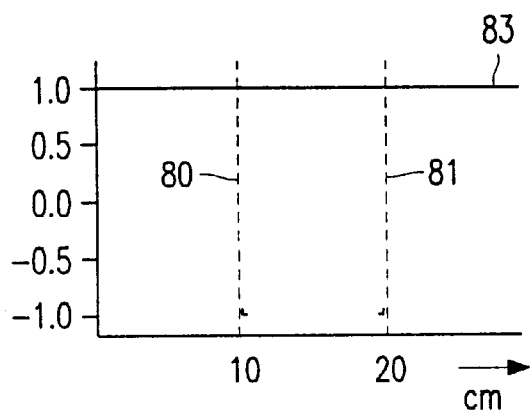
Figure 8:
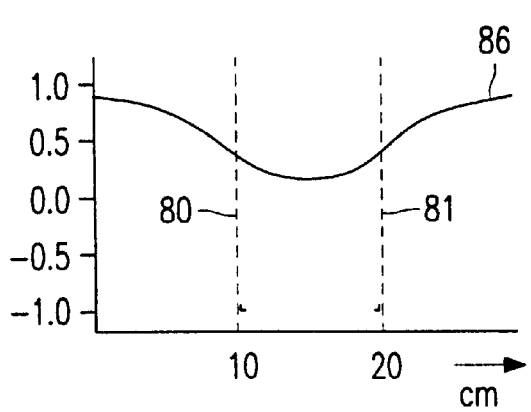
Figure 8:
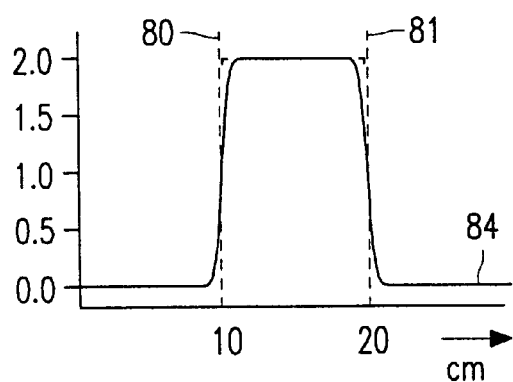
Figure 8:
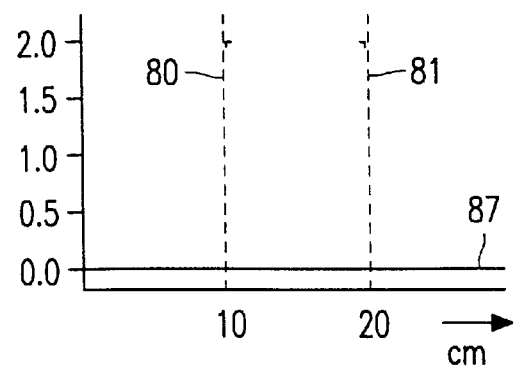

FIG. 8 graphically shows first estimates of the z magnetisation of free water and bound water as a function of distance along the z-direction. Preferably, the interval Δt$_1$ is chosen such that a transverse relaxation time T$_2$ of the bound water is short with respect to the interval Δt$_1$. The position of the second slice is indicated by the dotted lines 80, 81. The z-magnetisation of the free water outside the second slice after performing the second labelling pulse sequence 130, indicated by a seventh line 82. The z-magnetisation of the free water outside the second slice after performing the first control pulse sequences 140, is indicated by an eighth line 83. The difference between the z-magnetisation values after performing the second labelling and control pulse sequences 130,140 is shown by a third line 84. The z-magnetisation of the bound water after performing the second labelling pulse sequence 130, indicated by a ninth line 85. The z-magnetisation of the bound water after performing the second control pulse sequences is 140, indicated by a tenth line 86. The difference between the z-magnetisation values of the bound water after performing the labelling and control pulse sequences 130,140 is shown by an eleventh line 87. The application of the second labelling and control pulse sequences results in a labelling slab of high quality even for fast arterial flow and large magnetic field inhomogeneities with respect to the size of the labelling slab.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A method for determining a perfusion image of a portion of a body placed in a static magnetic field by means of magnetic resonance (MR) comprising:
    generating a control pulse sequence in a first portion of the body,
    measuring a control data set by generation of an MR-image sequence for imaging a third portion of the body to be imaged,
    generating a labelling pulse sequence in a second portion of the body wherein a fluid flows towards the third portion,
    measuring a labelled data set by generation of the MR-image sequence for imaging of the third portion of the body,
    reconstructing the perfusion image of the fluid in the third portion of the body from a combination of the control data set and the labelled data set,
    wherein the labelling pulse sequence comprises a first selective RF pulse and a second RF pulse, and the control pulse sequence comprises the first selective RF pulse and a third RF pulse, a phase of the second RF pulse being opposite to that of the third RF-pulse.

2. A method as claimed in claim 1 wherein the first selective RF pulse and the second RF pulse are applied according to a first modulation function of time and the third RF pulse is applied according to a second modulation function, which is the same as the first modulation function but of an opposite sign.

3. A method as claimed in claim 1 wherein:
    the labelling pulse and control pulse sequences comprise first and second magnetic field gradient pulses, the first magnetic field gradient pulses being applied with the first selective RF pulse according to a first gradient function of time,
    the second magnetic field gradient pulses being applied with the second RF pulse according to a second gradient function of time that is a time-reversed version of the first gradient function with the sign of the second gradient function being opposite to the sign of the first gradient function,
    the first selective RF pulse being applied according to a first amplitude modulation function of time and a first frequency modulation function of time,
    the second RF pulse being applied according to a second amplitude modulation function and a second frequency modulation function, the second amplitude modulation function being a time-reversed version of the first amplitude function, the second frequency modulation function being a time-reversed version of the first frequency modulation function, the sign of the second frequency modulation function being opposite to that of the first frequency modulation function, and
    the third RF pulse being applied according to a third amplitude modulation function and the second frequency modulation function, the third amplitude modulation function being the same as the second amplitude modulation function, but of opposite sign.

4. A method as claimed in claim 3 further comprising a step of generating a refocusing RF pulse between the first selective RF pulse and the second REF pulse and between the first selective RF pulse and the third RF pulse respectively.

5. The method of claim 4 wherein the flip angle of the first selective RF pulse and the flip angle of the second and third RF pulses equals about 90 degrees.

6. The method of claim 4 wherein an interval between the first and second pulses and an interval between the first and third RF pulses is larger than the transverse relaxation time of bound water.

7. The method of claim 4 further comprising a step of processing information from the reconstructed image to determine the quantity of the fluid perfused in the third portion of the body.

8. The method of claim 3 wherein the flip angle of the first selective RF pulse and the flip angle of the second and third RF pulses equals about 90 degrees.

9. The method of claim 3 wherein an interval between the first and second pulses and an interval between the first and third RF pulses is larger than the transverse relaxation time of bound water.

10. The method of claim 3 further comprising a step of processing information from the reconstructed image to determine the quantity of the fluid perfused in the third portion of the body.

11. A method as claimed in claim 1 wherein a flip angle of the first selective RF pulse and a flip angle of the second and third RF pulses equals about 90 degrees.

12. A method as claimed in claim 1 wherein an interval between the first and second pulses and an interval between the first and third RF pulses are both larger than the transverse relaxation time of bound water.

13. The method of claim 12 further comprising a step of processing information from the reconstructed image to determine the quantity of the fluid perfused in the third portion of the body.

14. A method as claimed in claim 1 further comprising a step of processing information from the reconstructed image to determine the quantity of the fluid perfused in the third portion of the body.

15. An MR device for obtaining images of a region of a body comprising:

means for generating a substantially uniform steady magnetic field in the region of the body, means for generating temporary magnetic gradient fields, means for generating RF pulses, means for receiving MR signals, processing means for reconstructing an image from the MR signals received, and control means for supplying control signals to the means for generating temporary magnetic gradient fields and the means for generating RF pulses, so that according to the control signals:

(i) a control data set is measured by generating a control. pulse sequence in a first portion of the body, and an MR-image sequence is generated for imaging of an third portion of the body, (ii) a labelled data set is measured by generating a labelling pulse sequence in a second portion of the body wherein a fluid flows towards the third portion, and the MR-image sequence is generated for imaging the third portion of the body, and (iii) a perfusion image of the fluid in the third portion of the body is reconstructed from a combination of the control data set and the labelled data set, wherein the labelling pulse sequence comprises a first selective RF pulse and a second RF pulse, the control pulse sequence comprises the first selective RF pulse and a third RF pulse, a phase of the second RF pulse being opposite to that of the third RF pulse.

* * * * *